(12) United States Patent
Stoupis et al.

(10) Patent No.: US 7,672,812 B2
(45) Date of Patent: Mar. 2, 2010

(54) CABLE FAULT DETECTION

(75) Inventors: James Stoupis, Durham, NC (US); Ajay C. Madwesh, Allentown, PA (US); David Lubkeman, Cary, NC (US)

(73) Assignee: ABB Research Ltd., Zurich (DE)

( * ) Notice: Subject to any disclaimer, the term of this patent is extended or adjusted under 35 U.S.C. 154(b) by 590 days.

(21) Appl. No.: 11/555,429

(22) Filed: Nov. 1, 2006

(65) Prior Publication Data

US 2008/0100307 A1   May 1, 2008

(51) Int. Cl.
*G01R 31/02* (2006.01)

(52) U.S. Cl. ............... 702/185; 702/59; 702/60; 324/527; 324/512; 324/539; 361/81; 361/100

(58) Field of Classification Search .......... 702/59, 702/60, 185; 324/532, 527, 512, 536, 543, 324/522, 539; 361/81, 100
See application file for complete search history.

(56) References Cited

U.S. PATENT DOCUMENTS

| | | | | |
|---|---|---|---|---|
| 4,227,145 | A * | 10/1980 | Bonikowski et al. | 324/543 |
| 4,254,374 | A * | 3/1981 | Trihus | 324/539 |
| 4,446,420 | A * | 5/1984 | Drouet | 324/522 |
| 5,428,342 | A * | 6/1995 | Enoki et al. | 340/511 |
| 5,886,861 | A * | 3/1999 | Parry | 361/42 |
| 6,144,721 | A | 11/2000 | Stephens | |
| 6,198,401 | B1 | 3/2001 | Newton et al. | |
| 6,754,597 | B2 * | 6/2004 | Bertsch et al. | 702/57 |
| 6,798,211 | B1 * | 9/2004 | Rockwell et al. | 324/527 |
| 6,822,457 | B2 * | 11/2004 | Borchert et al. | 324/512 |
| 6,868,357 | B2 * | 3/2005 | Furse | 702/108 |
| 7,176,589 | B2 * | 2/2007 | Rouquette | 307/17 |
| 7,304,826 | B2 * | 12/2007 | Yuan et al. | 361/19 |
| 2003/0085715 | A1 * | 5/2003 | Lubkeman et al. | 324/509 |
| 2007/0093977 | A1 * | 4/2007 | Yuan et al. | 702/58 |

FOREIGN PATENT DOCUMENTS

| | | | |
|---|---|---|---|
| DE | 3812433 A | * | 10/1989 |
| EP | 1850109 A1 | * | 10/2007 |
| JP | 2001045666 A | * | 2/2001 |
| WO | PCT/US2007/022543 | | 6/2009 |

OTHER PUBLICATIONS

Williams, et al., Sub-cycle detection of incipient cable splice faults to prevent cable damage, Power Engineering Society Summer Meeting 2000, 2000, pp. 1175-1180, vol. 2, IEEE.

(Continued)

*Primary Examiner*—Carol S Tsai
(74) *Attorney, Agent, or Firm*—Paul R. Katterle; Driggs, Hogg, Daugherty & Del Zoppo Co., L.P.A.

(57) ABSTRACT

A cable fault detection component (168) receives input data indicative of a fault in an electrical power system. The component (168) analyzes the input data to determine if the fault is indicative of a self-clearing cable fault and generates corresponding output data (276). In one implementation, the cable fault detection component (168) is implemented as a software module which operates on a computer (105) of a substation intelligence system (104).

13 Claims, 3 Drawing Sheets

OTHER PUBLICATIONS

Advance Control Systems, Inc. Substation Automation Product Overview, Mar. 2003, 2 pages, www.acsatlanta.com.

Kreiss Johnson Technologies, Inc., Open advancing substation automation, 2003, 13 pages, www.kjt.com.

David Kreiss, Non-Operational Data: The Untapped Value of Substation Automation, Utility Automation & Engineering T&D, 2003, 4 pages, Sep./Oct. 2003 edition, http://uaepl.pennnet.com/Articles/Articles_Display.cfm?Section=ONART&Catagory=PRODJ&PUBLICATION_ID=22&ARTICLE_ID=192304&VERSION_NUM=3.

Kreiss et al., Utilities Can Enhance Bottom Line by Leveraging Non-Operational Data, Utilities Automation & Engineering T&D, Nov. 2003, 4 pages, Nov./Dec. 2003 edition, http://uaelp.pennnet.com/Articles/Article_Display.cfm?Section=ARCHI&ARTICLE_ID=195081&VERSION_NUM=1&p=22.

McArthur, et al., Multi-Agent System for Diagnostic and Condition Monitoring Applications, Power Engineering Society General Meeting 2004, Jun. 2004, pp. 50-54, vol. 1, http://ieeexplore.ieee.org/xpl/absprintf.jsp?arnumber=137251&page=FREE.

Luo et al., Fault Analysis Based on Integration of Digital Relay and DFR Data, Power Engineering Society General Meeting 2005, Jun. 2005, pp. 746-751, vol. 1, http://ieeexplore.ieee.org/xpl/absprintf.jsp?arnumber=148941&page=FREE.

Kezunovic et al., Enhanced Reliability of Power System Operation Using Advanced Algorithms and IEDs for On-Line Monitoring, Part 1 of Final Project Report, Oct. 2005, 78 pages, Power Systems Engineering Research Center.

Erich W. Gunther, On Creating a New Format for Power Quality and Quantity Data Interchange, downloaded Oct. 27, 2006, 5 pages, http://grouper.ieee.org/groups/1159/3/docs/pqdif.pdf.

Kojovic, et al., Sub-cycle overcurrent protection for self-clearing faults due to insulation breakdown, downloaded Oct. 27, 2006, http://www.cipperpower.com/library/pdf/ICSF-Paper.pdf.

Mirrasoul J. Mousavi and Karen L. Butler-Purry, "Temporal analysis of power system measurements for condition assessment purposes", IEEE Power Engineering Society General Meeting, Jun. 2007, pp. 1-8.

C. J. Kim, "Identification of symptom parameters for failure anticipation by timed-event trend analysis", IEEE Power Engineering Review, vol. 20, No. 9, Sep. 2000, pp. 48-49.

C. J. Kim, Seung-Jae Lee and Sang-Hee Kang, "Evaluation of feeder monitoring parameters for incipient fault detection using Laplace trend statistic", IEEE Transactions on Industry Applications, vol. 40, No. 6, Nov.-Dec. 2004, pp. 1718-1724.

Kirama Kanoun and Jean-Claude Laprie, "Software reliability trend analyses from theoretical to practical considerations", IEEE Transactions on Software Engineering, vol. 20, No. 9, Sep. 1994, pp. 740-747.

Olivier Gaudoin, "Optimal properties of the Laplace Trend Test for software-reliability models", IEEE Transaction on Reliability, vol. 41, No. 4, Dec. 1992, pp. 525-532.

C. J. Kim, J. H. Shin, M. Yoo and G. W. Lee, "A Study on the Characterization of the Incipient Failure Behavior of Insulators in Power Distribution Line", IEEE Transactions on Power Delivery, vol. 14, No. 2, Apr. 1999, pp. 519-524.

W. E. Anderson, J. D. Ramboz and A. R. Ondrejka, "The detection of incipient faults in transmission cables using time domain reflectometry techniques: Technical challenges", IEEE Transactions on Power Apparatus and Systems, vol. PAS-101, No. 7, Jul. 1982, pp. 1982-1934.

K. L. Butler, "An expert system based framework for an incipient failure detection and predictive maintenance system," in Proc. 1996 Intelligent System Application to Power Systems Conf., Jan. 1996, pp. 321-326.

S. M. Miri and A. Privette, "A survey of incipient fault detection and location techniques for extruded shielded power cables", presented at the 26th Annual Southeastern Symposium on System Theory, Athens, Oh, 1994, pp. 402-405.

H. E. Orton, "Diagnostic testing of in-situ power cables: an overview", IEEE/PES Transmission and Distribution Conference and Exhibition 2002: Asia Pacific Conference, Yokohama, Japan, Oct. 2002, vol. 2, pp. 1420-1425.

R. Moghe, M. J. Mousavi, J. Stoupis, and J. McGowan, "Field investigation and analysis of incipient faults leading to a catastrophic failure in an underground distribution feeder", in Proc. 2009 Power Systems Conference and Exposition, Mar. 2009.

J. Cardoso and K. L. Butler, "Field studies of incipient behavior in damaged underground cable," in Proc. 60th Annu. American Power Conf., vol. 60-I, Chicago, IL, Apr. 14-16, 1998, pp. 522-526.

Rohit Moghe and Mirrasoul Mousavi,"Trend analysis Techniques for Incipient Fault Prediction," The 2009 IEEE PES General Meeting Advanced Program of Technical Sessions and Committee Meetings., Seattle, WA. Jul. 30, 2009.

\* cited by examiner

CABLE FAULT DETECTION

BACKGROUND

The present application relates to fault detection in electrical power transmission and distribution systems. It finds particular application to the detection and analysis of faults in underground and other cables used in the transmission and distribution of electrical power.

Underground and other cables are a key component in the transmission and distribution of electrical power. Unfortunately, however, cables can be prone to shorts or otherwise abnormally low impedance connections between two or more phases or between one or more phases and ground. These and other cable faults can be caused by a number of factors, including human error (e.g., accidentally cutting or striking a cable), climatologic conditions (e.g., precipitation, seismic activity, or lightning strikes), animal activity, and failure or degradation of the cable or its associated equipment. Moreover, cable faults can lead to power outages, which are inconvenient for the affected customers and which can be expensive for the electric utility involved.

One category of fault is that of self-clearing faults. While self-clearing faults can have any number of root causes, they typically have a temporal duration which is insufficient to trip the relevant protective device. In practice, the duration of most self-clearing faults is typically less than about two (2) to three (3) cycles of the power system frequency, and in many cases less than one (1) cycle.

One mechanism which can generate self-clearing cable faults is a breakdown in the insulation between cable phases or between a cable phase and ground. Such faults are often caused or exacerbated by moisture at a cable splice or joint, and are typically characterized by an elevated or fault current having a duration of about one-quarter to one-half cycle (i.e., roughly four (4) to eight (8) milliseconds (mS) in a sixty Hertz (60 Hz) system). The onset of the fault current usually occurs at or near a voltage peak. As the situation deteriorates, the frequency and severity of these faults tend to worsen with time, culminating in an eventual cable failure and a resultant power outage.

As a consequence, a fault detection apparatus has been incorporated in a protective relay platform which can be used as an intelligent electronic device (IED). See Kojovic, et al., *Sub-Cycle Overcurrent Protection for Self-Clearing Faults Due to Insulation Breakdown* (1999); U.S. Pat. No. 6,198,401 to Newton, et al., Detection of Sub-Cycle, Self-Clearing Faults, issued Mar. 6, 2001. More particularly, and as more fully described in the references, the apparatus samples the cable current signal as it occurs. Contemporaneously with detecting a current signal which exceeds a threshold value, the apparatus confirms that the circuit breaker did not operate and also evaluates succeeding current samples (again, contemporaneously with their occurrence) to determine whether duration of the fault is less than one (1) cycle. If these conditions are satisfied, the device increments a fault counter. If the number and/or frequency of such faults occurrences exceeds a certain setting, the apparatus initiates an alarm, signalization, and/or a trip. In an alternate implementation, the apparatus also determines whether the fault occurred near a voltage peak.

However, the fault detection apparatus is provided at the level of the protective relay. One consequence of this relay-centric architecture is that the apparatus is relatively poorly integrated with the substation automation (SA), distribution automation (DA), feeder automation (FA), or other automation system. Moreover, the apparatus requires the use of a specialized hardware platform which must be closely coupled to the protective relay, and the detection techniques have been relatively unsophisticated.

SUMMARY

Aspects of the present application address these matters, and others.

According to one aspect, a method includes performing a Fourier transform of a time varying signal from an electrical power transmission or feeder cable and using the Fourier transformed signal to identify a cable fault.

According to another aspect, a computer readable storage medium contains instructions which, when executed by a computer processor, cause the processor to carry out a method. The method includes using frequency domain data from a fault in an electrical power system to identify a self-clearing cable fault and generating an output signal indicative of the identified cable fault.

According to another aspect, a cable fault detection apparatus includes a computer readable memory containing digital fault record data generated in response to a fault and a computer processor in operative communication with the memory. The computer processor executes computer readable instructions which cause the processor to analyze the digital fault record data to determine if the fault is indicative of a cable fault.

According to another aspect, a method includes obtaining oscillographic data generated in response to a power system fault and using a processor to evaluate the digital fault record data to determine if the power system fault is indicative of a self-clearing cable fault.

Those skilled in the art will appreciate still other aspects of the present invention upon reading an understanding the attached figures and description.

FIGURES

The present invention is illustrated by way of example and not limitation in the figures of the accompanying drawings, in which like references indicate similar elements and in which.

DESCRIPTION

Figure 1:
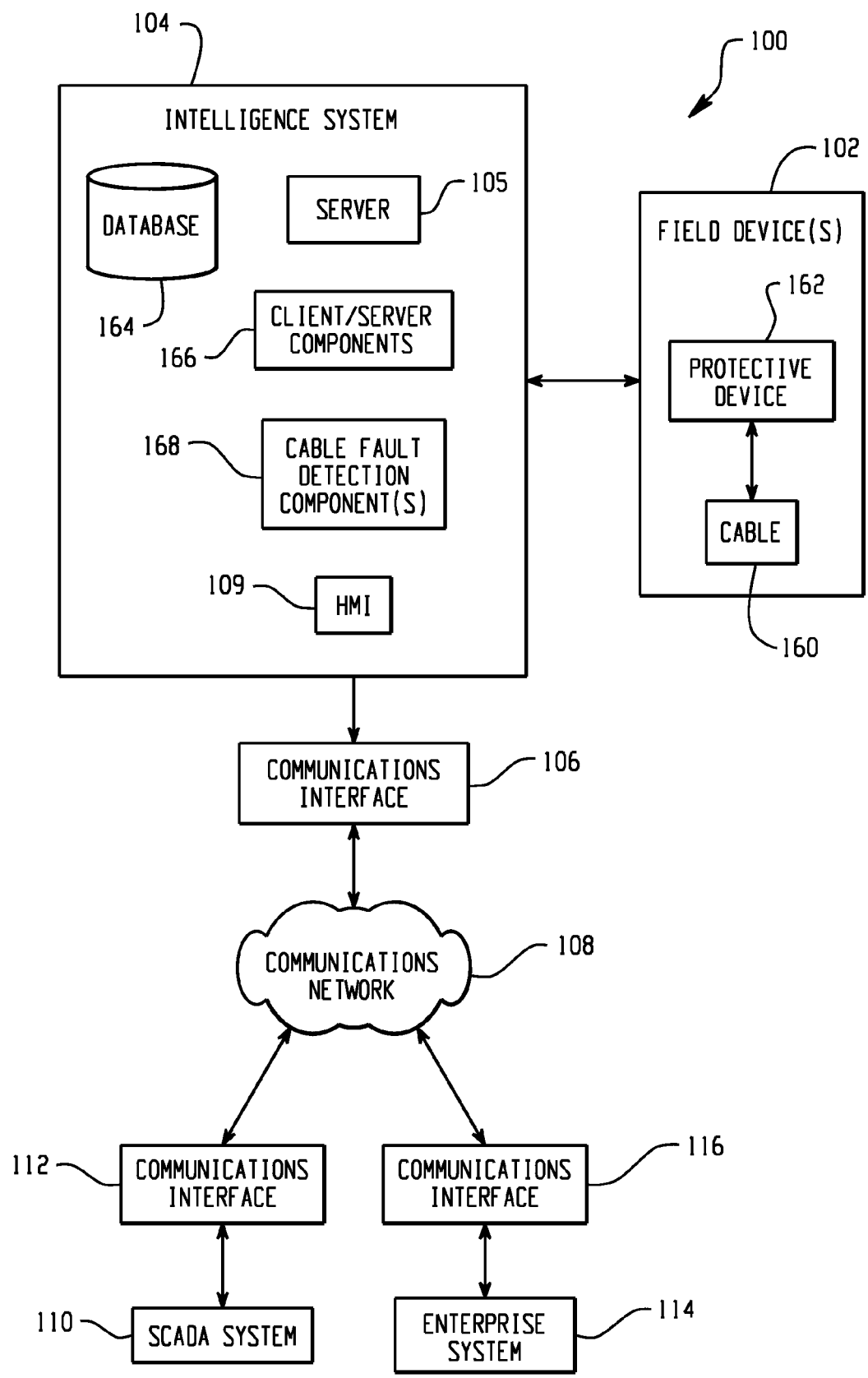
FIG. 1 depicts components of an electrical power distribution system.

With reference to FIG. 1, a substation 100 includes a plurality of field devices 102, a substation intelligence system 104 and a communication interface 106. The field devices 102 include transformers, capacitors, circuit breakers, intelligent electronic devices (IEDs) and other equipment and assets as are typically encountered in the substation environment. In the present example, the field devices 102 include one or more cables 160 such as transmission or feeder cables and associated protective devices 162.

The field devices 102 are operatively connected to the substation intelligence system 104. Depending on the architecture of a given system, the intelligence system 104 may function as one or more of a substation automation system, a feeder automation system, or a distribution automation system. As illustrated, the substation intelligence system 104 includes a server or other computer 105, a database 164, one or more client server components 166 and cable fault detection components 168, and an optional human machine interface (HMI) 109.

The communication interface 106 connects the substation intelligence system 104 to a wide area network (WAN), the internet, or other communications network(s) 108.

A supervisory control and data acquisition (SCADA) system 110 connects to the communications network 108 via suitable communications interface(s) 112. The SCADA system 110 is typically located remotely from the substation 100 and provides supervisory control functions for a plurality of substations 100 and/or other components of the power generation and distribution system.

The substation intelligence system 104 may also be connected to one or more enterprise computer systems such as data warehouses, data marts, planning systems, geographic information systems (GIS), or centralized maintenance management systems (CMMS) 114, which are likewise connected to the communications network 108 through communication interfaces 116.

As noted above, the cables 160 may include one or more transmission or feeder cables. Transmission cables are typically used to transmit high-voltage electricity from a generation source or substation to another substation in the electric distribution system. Feeder cables are typically used to provide an electrical connection between the output of a substation and the input of downstream primary circuits. Feeder cables which leave the substation are sometimes termed substation exit cables. It should be noted, however, that the cables 160 are not necessarily located within the physical boundaries of the substation 100 and may in fact be located some distance from the substation. Depending on siting and other considerations, some or all of the cable 160 may be underground cables.

The protective devices 162 typically include one or more protective relays and associated circuit breakers or reclosers. The protective relays are advantageously implemented as IED-based devices which, among other functions, monitor the voltage current, and other relevant parameters of their associated cables 160, for example to detect various fault conditions, such as those caused by current, voltage, and/or frequency disturbances and which may or may not be caused by a cable fault.

Upon detecting a fault condition, the protective relays capture digital fault record (DFR) data such as voltage, current, and other oscillographic data and set a DFR flag indicating the occurrence of the fault. The DFR data is formatted for transmission in the known common format for transient data exchange (COMTRADE) or other suitable file format. Depending on the nature and severity of the fault, the protective relay may also trip the associated breaker.

With ongoing reference to FIG. 1, the client/server components 166 are advantageously implemented as software or firmware modules which are stored in a memory or other computer readable storage medium accessible to the computer 105. Execution of the components 166 is typically driven by either a timer (timed polling) or trigger-based (interrupting) mechanism so as to operate substantially in real time. Thus, for example, a client/server component 166 may from time-to-time poll a particular protective device 162 to obtain information relating to its status. Where the protective device 162 has set a DFR flag, the client/sever component 166 obtains the DFR data from the protective device 162 and generates an alarm or fault log in which the DFR data is stored at an appropriate location in the database 166, again in the COMTRADE or other suitable format. In the case of a trigger-based implementation, receipt of a DFR flag from a protective device triggers acquisition of the DFR data and generation of the fault log.

With still further reference to FIG. 1, the cable fault detection component 168 is likewise implemented as a software or firmware module which is stored in a memory or other computer readable storage medium accessible to the computer 105. The component 168 is also executed by the computer 105 on a polled, triggered, or other suitable basis. As will be described in further detail below, the cable fault detection component 168 analyzes the DFR and/or other relevant input data to detect a signature associated with a cable fault. Upon detecting such a signature, the component 168 generates one or more outputs indicative of the fault for storage in the database 164.

The HMI 109, which may be implemented in a software layer or otherwise in software which is distinct from that of the various components 166, 168, provides desired operator interface functionality, for example to allow a user to interact with the various modules 166, 168, the database 164, or other components of the substation intelligence system 104. In one implementation, the HMI 109 is implemented as software or other computer readable instructions which implement a graphical user interface (GUI) on a suitable computer. User interfaces implemented in connection with the SCADA system 110 or the enterprise system 114, if any, may also allow a user to mine the data from one or more sources or otherwise provide desired HMI functionality.

Figure 2:
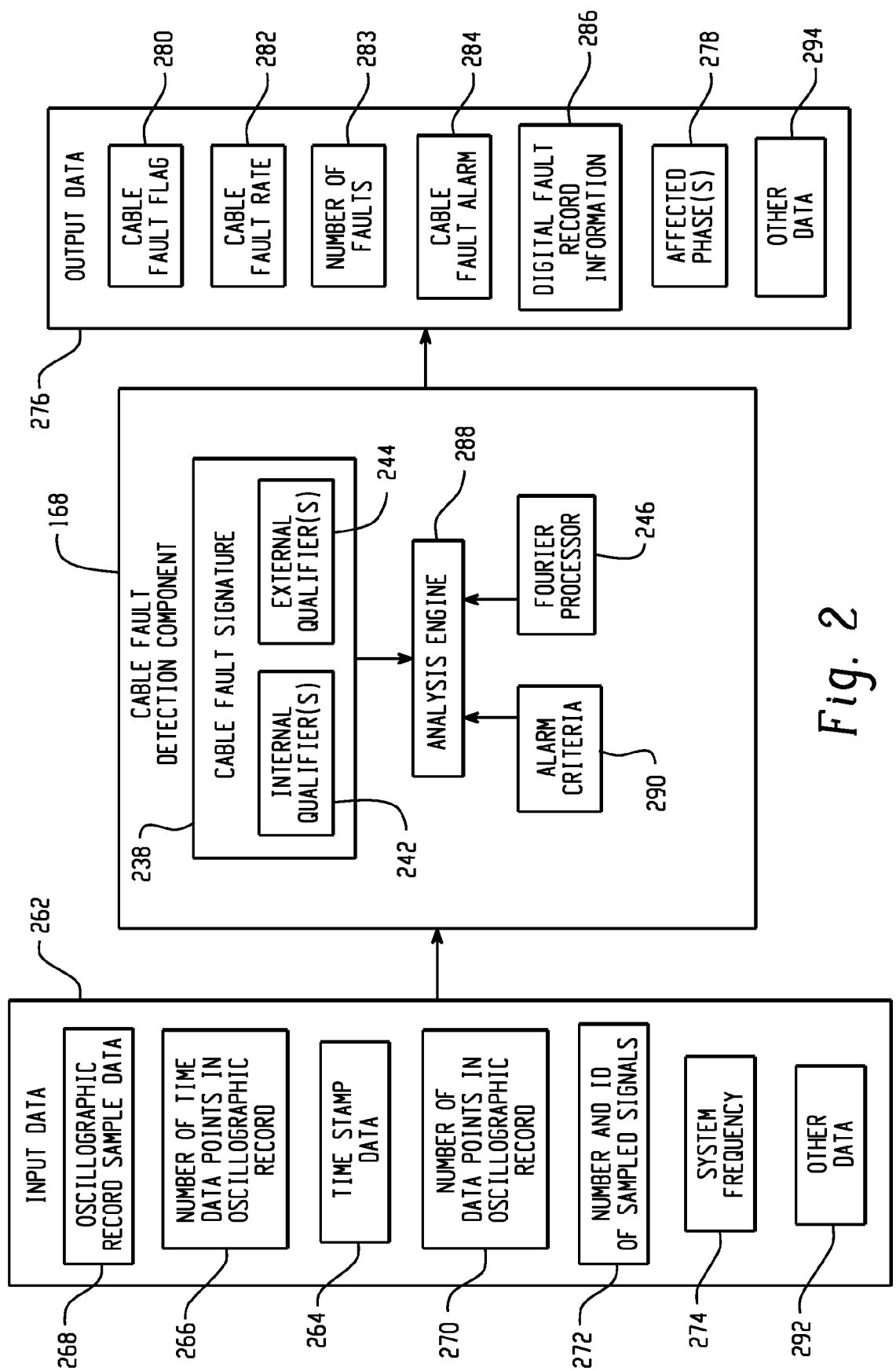
FIG. 2 depicts a substation intelligence system.

A functional block diagram depicting an exemplary cable fault detection component 168 in relation to its input 262 and output 276 data is shown in FIG. 2. The input data 262 includes oscillographic record data 268 such as time and sample data vectors, the number of sampled data points in the oscillographic record 266, time stamp data 264 such as the date and time at which the record was acquired, the number and identification of the sampled signals 272 (e.g., the number and identification of the sampled phase or phases), the system frequency 274, and other relevant data 292.

As illustrated, the detection component 268 includes an analysis engine 288 which operates in conjunction with a Fourier processor 246, cable fault signature criteria 238, and alarm criteria 290.

The Fourier transform processor 246, which is again advantageously implemented using suitable computer readable instructions, performs a discrete Fourier transform (DFT) of the voltage and/or current samples in the oscillographic record 268. In one implementation, the DFT is calculated over sample windows or time periods which begin at intervals corresponding to one quarter (¼) cycle of the power system frequency and which have a duration corresponding to one half (½) cycle of the system frequency, although different window intervals and durations are also contemplated. As will be appreciated, performing a DFT of the time varying cable current samples generates frequency domain data indicative of the frequency component(s) of the cable current during a particular sampling window. The frequency domain data includes a peak at the power system frequency, the magnitude of which is indicative of the cable current during the period covered by the DFT.

The cable fault signature 238 includes internal power system qualifiers 242 and optional external qualifiers 244 which are indicative of a cable fault. In the exemplary case of a cable fault signature 238 associated with a self-clearing fault resulting from an insulation breakdown at a cable splice or joint, the internal qualifiers 242 include a threshold cable current value, a threshold fault duration, and a fault onset criterion, although additional or different qualifiers may also be considered. Again in the case of a joint insulation breakdown, the external qualifiers 244 may include meteorological data such as precipitation, humidity, and/or ambient temperature.

The alarm criteria 290 include those criteria which are used to signal an alarm condition. In the case of a signature 238 associated with an insulation breakdown, the alarm criteria may include a fault rate or frequency and/or a number of faults, although additional or different criteria are also contemplated. Note that one or more of the cable fault signature 238 and alarm 290 criteria may be adjustable, for example by the user via a GUI implemented on the HMI 109 or otherwise.

The analysis engine 288 evaluates the input data 262 to determine whether the fault satisfies the cable fault signature criteria 238. Again in the exemplary case of a cable fault caused by an insulation breakdown, the analysis engine 288 evaluates the Fourier transformed current signal to determine whether the magnitude of the cable current exceeds the threshold value. The analysis engine 288 also determines whether the duration of the fault is less than the threshold fault duration, whether the onset of the fault occurred at or near a voltage peak, and whether the fault was self-clearing. In an implementation which includes external qualifier(s) 244, the analysis engine 288 also evaluates the relevant other input data 292, for example to determine whether the relative humidity exceeds a desired value. Where the component 168 includes alarm criteria 290, the analysis engine also determines whether the desired alarm criteria have been satisfied, for example to determine whether the rate or frequency of the cable faults exceeds the specified fault rate.

The cable fault detection component 168 uses the results of the evaluation to generate output data 276 such as one or more of a cable fault detected signal or flag 280, a cable fault rate or frequency 282, the number of cable faults 283, a cable fault alarm signal or flag 284, digital fault record data 286 such as the magnitude and duration of the fault, the phase or phase(s) affected by the fault 278, or other data 294. The output data is advantageously stored as one or more points in the substation intelligence system database 164 together with a suitable time stamp.

Various alternatives and extensions are also contemplated. For example, the detection component 168 may, alternatively or additionally, use other operational or non-operational data 262 as inputs to the cable fault analysis, with the cable fault signature criteria 238 selected accordingly. In one such implementation, the sampled voltage waveform is also be considered, for example to determine whether a period of increased current is accompanied by a dip in the sampled voltage.

If, as another example, heating caused by relatively higher values of cable current is expected to contribute to a cable fault, the average current values may be considered as appropriate. As still another example, other ambient or meteorological data such as lightning strikes, seismic activity, or the like may also be considered.

The detection component 168 may also calculate a probability or likelihood that a particular cable fault results from a particular fault mechanism, for example by assigning relative weights to the various signature criteria 238. The detection component 168 may include or otherwise access an internal or external database containing empirically or heuristically derived cable fault signatures 238 indicative of various cable fault mechanisms. In such a case, the cable fault output signal or flag 280 may also indicate the most likely fault mechanism or mechanisms. Separate outputs or flags may also be provided.

The detection component 168 may be utilized in intelligence systems 104 such as those described in commonly-owned U.S. patent application Ser. No. 11/555,393 by Stoupis, et al., and entitled Electrical Substation Monitoring and Diagnostics, which application was filed on Nov. 1, 2006 and is expressly incorporated by reference in its entirety herein.

As noted above, the detection component 168 advantageously operates on data having the COMTRADE or other desired format. Thus, the detection component 168 component may be executed on a computer or process other than the server computer. For example, the detection component may be executed on a computer associated with the SCADA system 110 or the enterprise system 114, or otherwise on another suitable general purpose or dedicated processor which has access to the desired input data 262 over the communication network 118. Some or all of the component 168 may also be implemented in digital and/or analog hardware.

Various alternative Fourier transform algorithms are also contemplated. According to one such alternative, the discrete Fourier transform may be implemented using a suitable fast Fourier transform (FFT) algorithm. While the above discussion has focused on an analysis engine 288 which operates on frequency domain data, other analysis engines are contemplated. Thus, for example, the analysis engine 288 may perform one or more of time-domain based, rule-based, neural network, expert system, analytical, or other suitable analyses.

Figure 3:
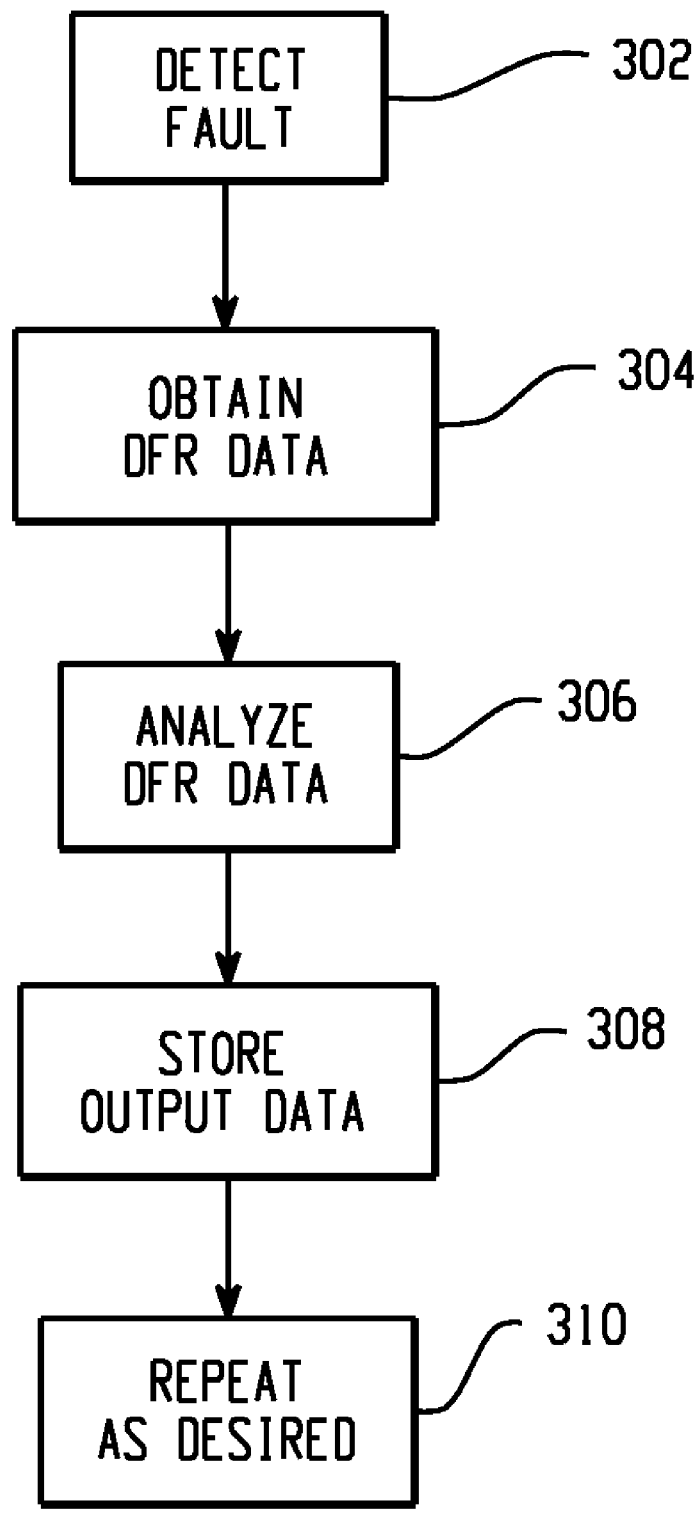
FIG. 3 depicts a cable fault detection module.

Operation will now be described in relation to FIG. 3. A fault is detected at step 302. More particularly to the exemplary implementation described above, a protective device 162 sets a DFR flag and generates DFR data in the COMTRADE or other suitable format.

The DFR data is obtained at step 304. Thus, for example, the DFR data is obtained by the intelligence system 104 and stored in the database 164 for use by the detection component 168. Alternately, the input data 262 is obtained directly by the detection component 168.

The DFR and other relevant input data is analyzed at step 306. As described above, for example, the cable fault detection component 168 evaluates the input data to determine whether the input data is indicative of a cable fault. In an implementation in which the detection component 168 considers signatures indicative of various cable fault mechanisms, the input data is evaluated against the various signatures. Depending on the results of the analysis, desired output data 276 such as one or more of a cable fault detection signal, cable fault number or rate, cable fault alarm, or cable fault mechanism output is generated.

At step 308, the output data 276 is stored in the database 164 or other desired location.

At step 310, the process is repeated, for example on a substantially real time basis during the operation of the power system.

Of course, modifications and alterations will occur to others upon reading and understanding the preceding description. It is intended that the invention be construed as including all such modifications and alterations insofar as they come within the scope of the appended claims or the equivalents thereof.

What is claimed is:

1. A method of analyzing a fault condition in a cable carrying AC power, the method comprising:
   detecting a fault condition in the cable;
   upon detecting the fault condition in the cable, obtaining data concerning characteristics of the AC power for a predetermined period of time;
   performing a Fourier transform of the data; and
   using the Fourier transformed data to determine whether the fault condition comprises a cable fault;
   wherein the data comprises oscillographic data indicative of a time varying signal; and wherein the time varying signal is generally periodic and the step of performing includes Fourier transforming current data acquired over a time period which corresponds to about one-half cycle of the signal.

2. The method of claim 1 wherein the Fourier transform includes a discrete Fourier transform.

3. The method of claim 1 wherein the cable fault includes an insulation breakdown.

4. The method of claim 1 wherein the step of using includes determining a magnitude of the Fourier transformed data.

5. The method of claim 1, wherein the method further comprises formatting the data for transmission.

6. The method of claim 5 wherein the oscillographic data is generated by a protective relay.

7. The method of claim 1, wherein a computer of a substation automation, distribution automation, or feeder automation system performs the step of using the Fourier transformed signal.

8. The method of claim 1, wherein the step of obtaining data comprises obtaining the oscillographic data indicative of the time varying signal over a wide area network.

9. The method of claim 1 further comprising:
upon determining that the fault condition is a cable fault, generating an output signal indicative of the cable fault and storing the output signal in a database of a substation automation, feeder automation, or a distribution automation system.

10. A tangible computer readable storage medium containing instructions which, when executed by a computer processor, cause the processor to carry out a method of analyzing a fault condition that has been detected in a cable carrying AC power, the method comprising the steps of:
obtaining data concerning characteristics of the AC power, the data having been collected for a predetermined period of time after the detection of the fault condition in the cable;
performing a Fourier transform of the data; and
using the Fourier transformed data to determine whether the fault condition comprises a cable fault;
wherein the data comprises oscillographic data indicative of a time varying signal;
wherein the method comprises receiving the oscillographic data from an IED and storing the oscillographic data in a substation automation system database; and
wherein the step of obtaining data includes obtaining the oscillographic data from the substation automation system database.

11. The computer readable storage medium of claim 10 wherein using the Fourier transformed data includes calculating a magnitude of a current in the cable and comparing the magnitude to a threshold value.

12. The computer readable storage medium of claim 10, wherein the cable fault includes an insulation breakdown.

13. The computer readable storage medium of claim 10, wherein when a fault condition is determined to be a cable fault, the method further comprises generating output data indicative of the cable fault and storing the output data in the substation automation system database.

* * * * *